United States Patent
Chen

(10) Patent No.: US 10,930,643 B2
(45) Date of Patent: Feb. 23, 2021

(54) FILTER CIRCUIT BASED ON A MOS FIELD EFFECT TRANSISTOR AND CHIP INCLUDING THE SAME

(71) Applicant: Shenzhen Goodix Technology CO., LTD., Guangdong (CN)

(72) Inventor: Jianxing Chen, Guangdong (CN)

(73) Assignee: SHENZHEN GOODIX TECHNOLOGY CO., LTD.

( * ) Notice: Subject to any disclaimer, the term of this patent is extended or adjusted under 35 U.S.C. 154(b) by 238 days.

(21) Appl. No.: 16/171,582

(22) Filed: Oct. 26, 2018

(65) Prior Publication Data

US 2019/0067272 A1 Feb. 28, 2019

Related U.S. Application Data

(63) Continuation of application No. PCT/CN2017/088201, filed on Jun. 14, 2017.

(51) Int. Cl.
*H01L 27/02* (2006.01)
*H02H 9/04* (2006.01)

(52) U.S. Cl.
CPC ........ *H01L 27/0274* (2013.01); *H01L 27/027* (2013.01); *H01L 27/0266* (2013.01); *H01L 27/0285* (2013.01); *H02H 9/046* (2013.01)

(58) Field of Classification Search
CPC ............... H01L 27/0274; H01L 27/027; H01L 27/0266; H01L 27/0285; H01L 27/0296; H02H 9/046; H02H 11/003
See application file for complete search history.

(56) References Cited

U.S. PATENT DOCUMENTS 6,919,602 B2 * 7/2005 Lin .................... H01L 27/0266
257/355
7,116,536 B2 * 10/2006 Jen-Chou ............... H02H 9/046
361/56

(Continued)

FOREIGN PATENT DOCUMENTS

CN 1702860 A 11/2005
CN 1933155 A 9/2006

(Continued)

OTHER PUBLICATIONS

European Report in connection with European Patent Application No. 17905914.2 dated May 21, 2019, 7 pgs.

(Continued)

*Primary Examiner* — Yusef A Ahmed

(57) ABSTRACT

Some embodiments of the application provide a filter circuit that is based on a MOS field effect transistor and a chip including the same. The filter circuit includes a first MOS field effect transistor and an electrostatic discharge unit; a gate of the first MOS field effect transistor and a substrate form a filter capacitance during normal operation; the electrostatic discharge unit and the first MOS field effect transistor form a discharge path that transfers aggregated electrostatic charges to ground when an ESD event occurs. On the basis of the first MOS field effect transistor, it is added to some embodiments of the present application an electrostatic discharge unit, which combines a capacitance characteristic and a characteristic of the ESD discharge path between the power supply and the ground to the same circuit, so that the circuit presents the capacitance characteristic during normal operation; an ESD discharge path is provided when an ESD event occurs between the power supply and the ground, which plays a role of ESD protection, thereby enhancing the ESD capability of the chip.

11 Claims, 4 Drawing Sheets

(56) References Cited

U.S. PATENT DOCUMENTS

| | | | |
|---|---|---|---|
| 9,397,090 B1* | 7/2016 | Chen | H01L 29/086 |
| 2003/0043523 A1* | 3/2003 | Hung | H02H 9/046 |
| | | | 361/111 |
| 2006/0103994 A1* | 5/2006 | Smith | H01L 27/0251 |
| | | | 361/56 |
| 2007/0030610 A1 | 2/2007 | Ker et al. | |
| 2007/0058306 A1* | 3/2007 | Poulton | H01L 27/0285 |
| | | | 361/56 |
| 2007/0096793 A1* | 5/2007 | Kato | H01L 27/0266 |
| | | | 327/524 |
| 2008/0232019 A1* | 9/2008 | Todd | H01L 27/0266 |
| | | | 361/111 |
| 2008/0303093 A1 | 12/2008 | Sai | |
| 2011/0063762 A1* | 3/2011 | Lee | H02H 9/046 |
| | | | 361/56 |
| 2012/0307410 A1* | 12/2012 | Yamazaki | H01L 21/823842 |
| | | | 361/88 |
| 2013/0182357 A1* | 7/2013 | Brodsky | H01L 27/0281 |
| | | | 361/56 |
| 2013/0235497 A1* | 9/2013 | Ma | H02H 9/046 |
| | | | 361/56 |
| 2015/0085406 A1* | 3/2015 | Chen | H02H 1/04 |
| | | | 361/55 |
| 2018/0374840 A1* | 12/2018 | Fukasaku | H01L 23/60 |
| 2019/0229107 A1* | 7/2019 | Fuchigami | H01L 27/0248 |

FOREIGN PATENT DOCUMENTS

| | | |
|---|---|---|
| CN | 1979842 A | 6/2007 |
| CN | 101099279 A | 1/2008 |
| EP | 1359620 A2 | 11/2003 |

OTHER PUBLICATIONS

Chinese Office Action in Chinese Application No. 1933155 dated Jan. 21, 2020, 6 pages.

* cited by examiner

FILTER CIRCUIT BASED ON A MOS FIELD EFFECT TRANSISTOR AND CHIP INCLUDING THE SAME

CROSS REFERENCE TO RELATED APPLICATIONS

This disclosure is a continuation of international application No. PCT/CN2017/088201, filed on Jun. 14, 2017, which is incorporated into this disclosure by reference in its entirety.

TECHNICAL FIELD

The present application relates to integrated circuit technologies and, more particularly, to a filter circuit based on a MOS field effect transistor and a chip including the same.

BACKGROUND

In general, during finishing process of a chip design, a filter circuit between a power supply and ground is added to a spare part of the chip. A chosen filter capacitance can be a MOS (Metal-Oxide-Semiconductor) field effect transistor capacitance, a MIM (Metal-Insulator-Metal) capacitance, or a MOM (Metal-Oxide-Metal) capacitance and the like. However, considering that a per-unit-area capacitance of the MOS field effect transistor capacitance (hereinafter referred to as a MOS capacitance) is greater than any other capacitance, a greater capacitance can be obtained under the same area. Therefore, in general, the MOS capacitance is selected as a filter capacitance.

The MOS capacitance is categorized into two types: a PMOS capacitance and a NMOS capacitance. FIGS. 1 and 2 respectively show a schematic diagram of the PMOS capacitance and the NMOS capacitance as a filter capacitance between the power supply and the ground. In general, this filter circuit only has a capacitive characteristic, but does not have a ESD (Electro-Static discharge) characteristic. In practical applications, however, ESD events often occur between the power supply and the ground, threatening security of the components inside the chip. Therefore, it is very important to enhance the ESD capability of the chip.

SUMMARY

Some embodiments of the present application aim to provide a filter circuit based on MOS field effect transistors, and a chip including the filter circuit, so that the filter circuit can present a capacitance characteristic when the chip works normally, and provide a ESD path when an ESD event occurs between the power supply of the chip and the ground, and enhance the ESD capability of the chip.

An embodiment of the present application provides a filter circuit based on MOS field effect transistors, including a first MOS field effect transistor and an electrostatic discharge unit; a filter capacitance is formed between a gate of the first MOS field effect transistor and a substrate during normal operation; the electrostatic discharge unit and the first MOS field effect transistor form a discharge path that transfers aggregated electrostatic charges to the ground during electrostatic discharge.

An embodiment of the present application further provides a chip, including the filter circuit based on MOS field effect transistors as described above, the filter circuit is provided between the power supply of the chip and the ground.

The embodiments of the present application, as compared to the existing technology, add an electrostatic discharge unit on the basis of the first MOS field effect transistor, which combines the capacitance characteristic and the characteristic of the ESD discharge path needed between the power supply and the ground to the same circuit, so that the circuit presents the capacitance characteristic during normal operation, having a function of filtering AC interference in the power supply; and provides the ESD discharge path when an ESD event occurs between the power supply and the ground, which plays the role of ESD protection, and is favorable to the enhancement of the ESD capability of the chip.

Also, the electrostatic discharge unit includes a second MOS field effect transistor and a third MOS field effect transistor; a drain of the first MOS field effect transistor, a drain of the second MOS field effect transistor and a drain of the third MOS field effect transistor are interconnected; a gate of the first MOS field effect transistor, a gate of the second MOS field effect transistor and a gate of the third MOS field effect transistor are all grounded; a source of the first MOS field effect transistor with the substrate and a source of the second MOS field effect transistor with the substrate are connected to a power supply; and a source of the third MOS field effect transistor with the substrate is grounded. A form of an electrostatic discharge unit and its connection structure with the first MOS field effect transistor are provided.

Also, the first MOS field effect transistor is a PMOS field effect transistor, the second MOS field effect transistor is a PMOS field effect transistor, and the third MOS field effect transistor is a NMOS field effect transistor. A type of the first MOS field effect transistor, second MOS field effect transistor and third MOS field effect transistor is provided.

Also, the gate of the second MOS field effect transistor is connected to the gate of the third MOS field effect transistor and then is grounded through a resistance. Connecting a resistance in series at a gate makes the Snap-back easier to turn on, making it easier to play the role of ESD protection.

Also, the electrostatic discharge unit includes the second MOS field effect transistor and the third MOS field effect transistor; the drain of the first MOS field effect transistor, the drain of the second MOS field effect transistor and the drain of the third MOS field effect transistor are interconnected; the gate of the first MOS field effect transistor, the gate of the second MOS field effect transistor, and the gate of the third MOS field effect transistor are all connected to the power supply; the source of the first MOS field effect transistor with the substrate and the source of the third MOS field effect transistor with the substrate are grounded; and the source of the second MOS field effect transistor with the substrate is connected to the power supply. Another connection structure of the electrostatic discharge unit with the first MOS field effect transistor is provided.

Also, the first MOS field effect transistor is a NMOS field effect transistor, the second MOS field effect transistor is a PMOS field effect transistor, and the third MOS field effect transistor is still a NMOS field effect transistor. Another type of the first MOS field effect transistor is provided.

Also, the gate of the second MOS field effect transistor is connected to the gate of the third MOS field-effect transistor and then is connected to the power supply through a resistance. Connecting a resistance in series at a gate makes the Snap-back easier to turn on, making it easier to play the role of ESD protection.

Also, the overall size of the first MOS field effect transistor is greater than the overall size of the second MOS field effect transistor; and the overall size of the first MOS field effect transistor is greater than the overall size of the third MOS field effect transistor. The greater the size is, the less the impedance is. This designed structure enables the first MOS field effect transistor to transfer more electrostatic charges to the ground, which helps to enhance the capacity of the ESD charge discharge.

Also, there is a parasitic triode between the drain and the source of the third MOS field effect transistor, and there is a parasitic resistance between a base of the parasitic triode and the substrate of the third MOS field effect transistor. When a large amount of charges are aggregated at the drain of the third MOS field effect transistor, a reverse PN junction between the drain of the third MOS field effect transistor and the substrate breaks down, and a current flows to the base of the parasitic triode and to the ground through the parasitic resistance, so that the base voltage of the parasitic triode is raised and the parasitic triode is turned on and a low-impedance discharge path is formed. The discharge path provides a path for the aggregated electrostatic charges to be quickly discharged to the ground.

Also, there is a parasitic triode between the drain and the source of the second MOS field effect transistor, and there is a parasitic resistance between a base of the parasitic triode and a substrate of the second MOS field effect transistor. When a large amount of charges are aggregated at the source of the second MOS field effect transistor, the reverse PN junction between the substrate and the drain of the second MOS field effect transistor breaks down, and a current flows to the base of the parasitic triode and to the drain through the parasitic resistance, so that the base voltage of the parasitic triode drops and the parasitic triode is turned on and a low-impedance discharge path is formed. The discharge path provides a path for the aggregated electrostatic charges to be quickly discharged to the drain.

BRIEF DESCRIPTION OF THE DRAWINGS

One or more embodiments are exemplified by the figures in the accompanying drawings, which is not a limit to the embodiments. Elements with the same reference numerals in the drawings are represented as similar elements. Unless otherwise stated, the figures in the drawings do not constitute a proportional limitation.

DETAILED DESCRIPTION

In order to make the purposes, the technical solutions and the advantages of this application clearer, some embodiments of the present application will be explained below in further detail with reference to the accompanying drawings and embodiments. It should be understood that the specific embodiments described herein only explain the application but do not limit the application.

A first embodiment of the application relates to a filter circuit that is based on a MOS field effect transistor. The filter circuit includes a first MOS field effect transistor and an electrostatic discharge unit.

The electrostatic discharge unit may be composed of multiple MOS field effect transistors, and cooperates with the first MOS field effect transistor so that a MOS capacitance can be formed as a filter capacitance between a gate of the first MOS field effect transistor and a substrate during normal operation, so that the filter circuit presents a capacitance characteristic. When an ESD event occurs between a power supply and ground, the electrostatic discharge unit can provide a low-impedance discharge path and transfer the aggregated electrostatic charges to the ground to achieve a goal of ESD protection.

The electrostatic discharge unit may be composed of two MOS field effect transistors, i.e., a second MOS field effect transistor and a third MOS field effect transistors, respectively. Taken the first MOS field effect transistor as a PMOS field effect transistor, the second MOS field effect transistor as a PMOS field effect transistor and the third MOS field effect transistor as a NMOS field effect transistor as an example, the connection structure of the first MOS field effect transistor and the electrostatic discharge unit is explained in detail in this embodiment.

Figure 3:
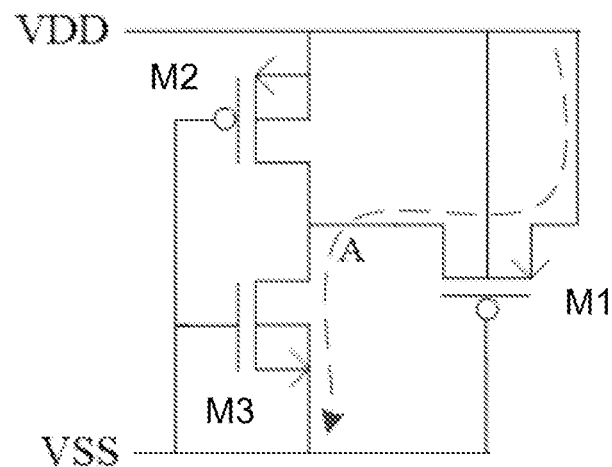
FIG. 3 is a schematic diagram of a filter circuit based on MOS field effect transistors according to a first embodiment of the application.

As illustrated in FIG. 3, a drain of a first MOS field effect transistor M1, a drain of a second MOS field effect transistor M2 and a drain of a third MOS field effect transistor M3 are interconnected (a point of connection of the three marked as A in FIG. 3); a gate of the first MOS field effect transistor M1 is connected to ground VSS, and a gate of the second MOS field effect transistor M2 and a gate of the third MOS field effect transistor M3 are interconnected and then connected to the ground VSS together; a source of the first MOS field effect transistor M1 with the substrate and a source of the second MOS field effect transistor M2 with the substrate are connected to a power supply VDD, and a source of the third MOS field effect transistor M3 with the substrate is connected to the ground VSS.

Figure 1:
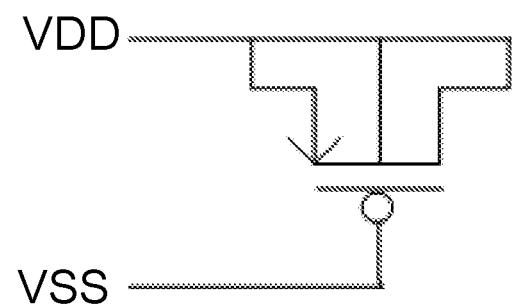
FIG. 1 is a schematic diagram of a circuit with a PMOS field effect transistor as a filter capacitance in the existing technology.

During normal operation, the third MOS field-effect transistor M3 is in an OFF state. In this case, the drain and the source of the third MOS field effect transistor M3 are in a disconnection state. While, the second MOS field-effect transistor M2 is in an ON state, therefore, the drain of the first MOS field effect transistor M1 can be connected to the power supply VDD via the second MOS field effect transistor M2. Accordingly, during normal operation, the equivalent circuit in FIG. 3 is the same as that in FIG. 1, and its function is also the same as that in FIG. 1. That is, a PMOS capacitance is formed between the gate of the first MOS field effect transistor M1 and the substrate (N type substrate), and is used as a filter capacitance to filter AC interference in the power supply. That is to say, during normal operation, the filter circuit provided by this embodiment presents the capacitance characteristic.

It is worth mentioning that, in this embodiment, the overall size of the first MOS field effect transistor M1 is much larger than the other two MOS field effect transistors (i.e. the second MOS field effect transistor M2 and the third MOS field effect transistor M3). Because the greater the size is, the less the impedance is, an impedance of the first MOS field effect transistor M1 is much smaller than that of the other two MOS field-effect transistors. So, when an ESD event occurs between the power supply and the ground, most of the charges from the power supply will reach the drain from the source of the first MOS field effect transistor M1, i.e., the point A, and are aggregated here. With an increase in electrostatic charges (i.e. charges aggregated at the point A), the voltage at the point A will be raised. When the voltage at this point is raised to a certain value (voltage value at which Snap-back is enabled), the third MOS field effect transistor M3 will be triggered to enable Snap-back, that is, a parasitic triode of the third MOS field effect transistor M3 will be triggered to turn on and a low-impedance discharge path is formed. The aggregated electrostatic charges can be discharged to the ground VSS through the low-impedance discharge path (an arrow in FIG. 3 shows the transfer path of a large majority of the charges during the electrostatic discharge) so as to protect internal components of the chip. That is to say, when an ESD event occurs between the power supply and the ground, the filter circuit in this embodiment can provide a low-impedance discharge path.

It is to be explained in the following on how the third MOS field-effect transistor M3 discharges electrostatic charges aggregated at the drain to the ground VSS.

Figure 4:
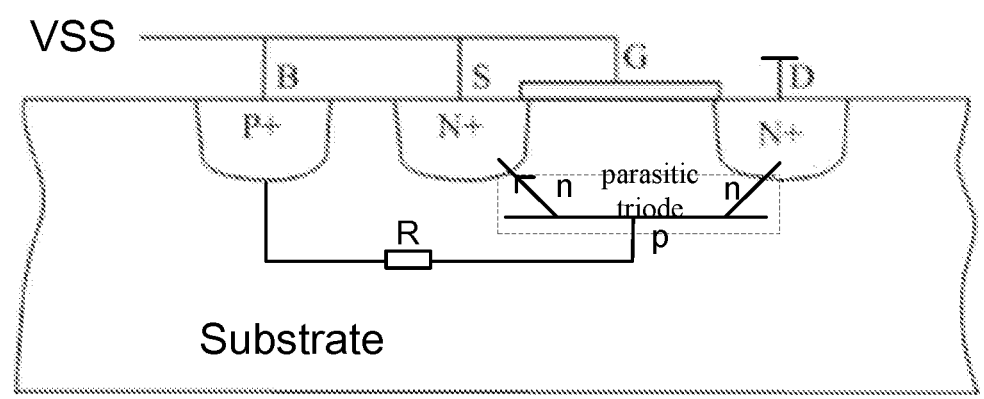
FIG. 4 is a sectional schematic diagram of a third MOS field effect transistor M3 according to the first embodiment of the application.

FIG. 4 shows a sectional structure of the third MOS field effect transistor M3, where there is a parasitic triode (NPN type) between a drain (D) and a source (S), and there is a parasitic resistance R between the base of the parasitic triode and the substrate of the third MOS field effect transistor. When a large number of charges are aggregated at the drain, the reverse PN junction between the drain and the substrate (P-substrate) will break down. At this time, the current will flow to the base of the parasitic transistor and flow to the terminal B (i.e., the ground VSS) through the parasitic resistance R, which raises a base voltage of the parasitic triode and turns the parasitic triode on, thereby enabling Snap-back to form a low-impedance discharge path. The aggregated electrostatic charge can be quickly discharged to the ground through the low-impedance discharge path.

It is worth noted that in the ESD protection, the breakover uniformity (also known as enabling uniformity) of the third MOS field effect transistor M3 can affect the performance of its electrostatic protection. In design, it is possible to increase the breakover uniformity by appropriately increasing a width of the drain (which is equivalent to increasing the resistance in the circuit and thereby reducing the current), thereby improving its ability of electrostatic discharge.

As compared to the existing technologies, in this embodiment, an electrostatic discharge unit is added on the basis of the first MOS field effect transistor. This design combines the capacitance characteristic and the characteristic of the ESD discharge path needed between the power supply and the ground to the same circuit, so that the circuit presents the capacitance characteristic during normal operation and plays the role of filtering AC interference in the power supply; an ESD discharge path is provided when an ESD event occurs between the power supply and the ground, which plays the role of ESD protection and is favorable for enhancing the ESD capability of the chip.

A second embodiment of the present application relates to a filter circuit that is based on a MOS field effect transistor. On the basis of the first embodiment, this embodiment further improves the structure of the filter circuit. The main improvement mainly lies in that in this embodiment, the gate of the second MOS field effect transistor is connected to the gate of the third MOS field effect transistor and is then connected to the ground VSS through a resistance.

Figure 5:
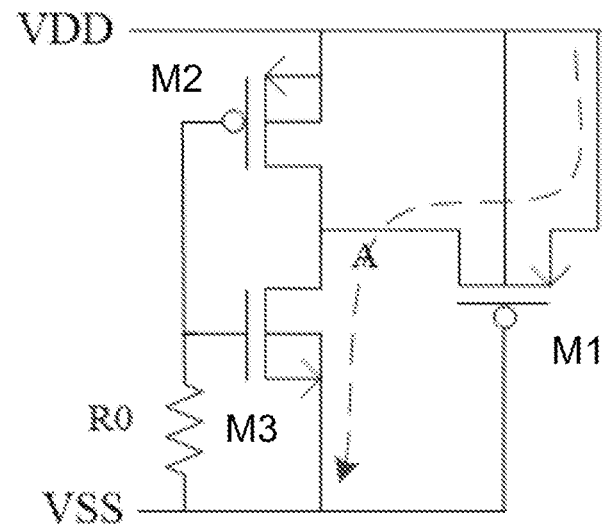
FIG. 5 is a schematic diagram of a filter circuit based on MOS field effect transistors according to a second embodiment of the application.

As shown in FIG. 5, the gate of the second MOS field-effect transistor M2 is connected to the gate of the third MOS field effect transistor M3 and then connected to the ground VSS through a resistance R0. There is a parasitic capacitance between the gate (G) and the drain (D) of the third MOS field effect transistor M3. The connection resistance R0 enables electrostatic charges to be coupled from the parasitic capacitance to the resistance R0, so that the third MOS field effect transistor M3 is in a weak conduction state when an ESD event occurs. In this case, the voltage for enabling Snap-back will be reduced, and it will more easily trigger the third MOS field effect transistor M3 to enable Snap-back. That is, when an ESD event occurs, the conduction of the parasitic triode of the third MOS field effect transistor can be triggered more easily and faster to form a low-impedance discharge path (an arrow in FIG. 5 shows a transfer path of a large majority of the charges upon electrostatic discharge), so that the aggregated electrostatic charges are quickly discharged to the ground, which is favorable for improving charge discharge ability of the chip and enhancing protection over components inside the chip.

In comparison with the first embodiment, this embodiment reduces the voltage for enabling the Snap-back of the third MOS field effect transistor, making it easier to trigger the parasitic triode of the third MOS field effect transistor to turn on when an ESD event occurs to form a low-impedance discharge path, which is favorable to the improvement of the charge discharge capacity.

A third embodiment of the present application relates to a filter circuit based on a MOS field effect transistor. The present embodiment can be used as an alternative embodiment of the first embodiment, and the difference between the two is that in the first embodiment, description is made when it is taken as an example that the first MOS field effect transistor is a PMOS field effect transistor, while in this embodiment, description is made when it is taken as an example that the first MOS field effect transistor is a NMOS field effect transistor.

Figure 6:
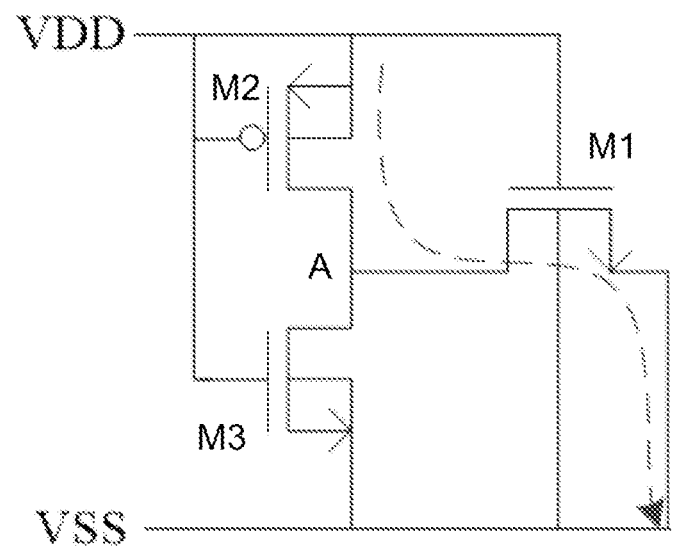
FIG. 6 is a schematic diagram of a filter circuit based on MOS field effect transistors according to a third embodiment of the application.

When the first MOS field effect transistor M1 is a NMOS field effect transistor, the second MOS field effect transistor M2 is still a PMOS field effect transistor and the third MOS field effect transistor M3 is still a NMOS field effect transistor, the connection structure of the three is as follows:

As shown in FIG. 6, a drain of the first MOS field effect transistor M1, a drain of the second MOS field effect transistor M2 and a drain of the third MOS field effect transistor M3 are interconnected (a point of connection of the three marked as A). A gate of the first MOS field effect transistor M1 is connected to the power supply VDD, a gate of the second MOS field effect transistor M2 and a gate of the third MOS field effect transistor M3 are interconnected and then connected to the power supply VDD. A source of the first MOS field effect transistor M1 with the substrate and a source of the third MOS field effect transistor M3 with the substrate are connected to the ground VSS; and a source of the second MOS field effect transistor M2 with the substrate is connected to the power supply VDD.

Figure 2:
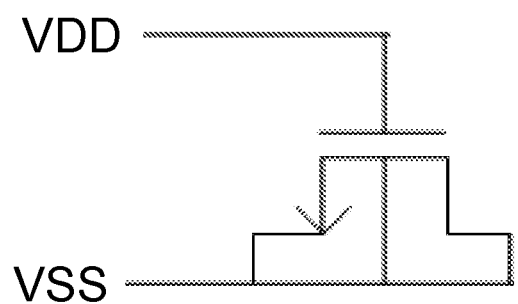
FIG. 2 is a schematic diagram of a circuit with a NMOS field effect transistor as a filter capacitance in the existing technology.

During normal operation, the second MOS field effect transistor M2 is in an OFF state. In this case, the drain and the source of the second MOS field effect transistor M2 are equivalent to be in a disconnection state. The third MOS field effect transistor M3 is in an ON state. Therefore, the drain of the first MOS field effect transistor M1 can be connected to the ground VSS via the third MOS field effect transistor M3. In this case, the equivalent circuit in FIG. 5 is the same as that in FIG. 2, and its function is also the same as that in FIG. 2. That is, a NMOS capacitance is formed between the gate of the first MOS field effect transistor M1 and the substrate, which is used as a filter capacitance to filter AC interference in the power supply. That is to say, during normal operation, the filter circuit provided by this embodiment presents the capacitance characteristic.

When an ESD event occurs between the power supply and the ground, the electrostatic charges aggregated at the source of the second MOS field effect transistor M2 will raise the voltage at that point. When the voltage at this point is raised to a certain value (voltage value at which Snap-back is enabled), it will trigger the second MOS field effect transistor M2 to enable Snap-back, that is, to trigger the parasitic triode of the second MOS field-effect transistor M2 to turn on and form a low-impedance discharge path. As a result, the aggregated electrostatic charges can be discharged to the point A through the low-impedance discharge path.

In one example, there is a parasitic triode (PNP type) between the drain and the source of the second MOS field effect transistor, and there is a parasitic resistance between the base of the parasitic triode and the substrate of the second MOS field effect transistor. When a large number of charges are aggregated at the source of the second MOS field effect transistor, the reverse PN junction between the substrate and the drain of the second MOS field effect transistor breaks down. At this time, the current flows to the base of the parasitic triode, and to the drain (the point A) through the parasitic resistance, which reduces the base voltage of the parasitic triode, turns on the parasitic triode, and enables Snap-back, so that a low-impedance discharge path is formed. The aggregated electrostatic charges can be quickly discharged to the point A through the low-impedance discharge path.

Similarly, in this embodiment, the overall size of the first MOS field effect transistor M1 is still much greater than the overall size of the other two MOS field effect transistors, that is to say, the impedance of the first MOS field effect transistor M1 is much smaller than the impedances of the other two MOS field effect transistors. Therefore, after the charges are discharged to the point A, a large majority of the charges will flow to the source of the first MOS field effect transistor M1, and then from the source of the first MOS field effect transistor M1 to the ground VSS (an arrow in FIG. 6 shows the transfer path of the large majority of the charges during the electrostatic discharge); only a small amount of them will flow to the source of the third MOS field effect transistor M3 and then to the ground VSS. Being compared to the previous part, the latter amount may substantially be neglected.

As compared to the first embodiment, this embodiment provides another type of the first MOS field effect transistor M1, as well as a connection structure between the electrostatic discharge unit and the first MOS field effect transistor.

A fourth embodiment of the present application relates to a filter circuit that is based on a MOS field effect transistor. Based on the third embodiment, this embodiment further improves the structure of the filter circuit. The main improvement is that in this embodiment, the gate of the second MOS field effect transistor is connected to the gate of the third MOS field effect transistor and is then connected to the power VDD through a resistance.

Figure 7:
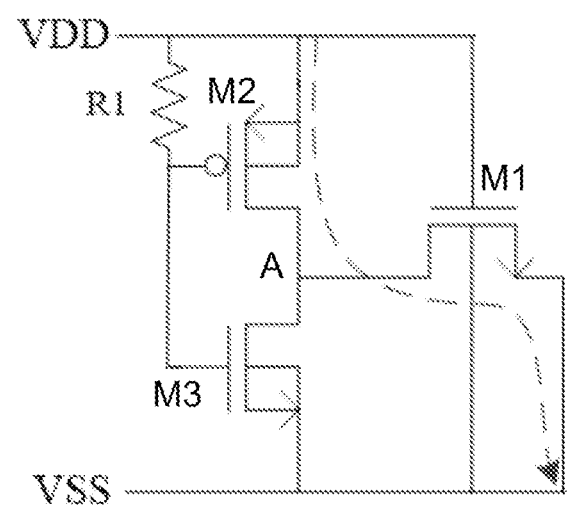
FIG. 7 is a schematic diagram of a filter circuit based on MOS field effect transistors according to a fourth embodiment of the application.

As shown in FIG. 7, the gate of the third MOS field effect transistor M3 is connected to the gate of the second MOS field effect transistor M2, and is then connected to the power supply VDD through the resistance R1. Similarly, the connection resistance R1 enables the second MOS field effect transistor to be in a weak conduction state when an ESD event occurs, thereby reducing the value of voltage for enabling Snap-back of the second MOS field effect transistor, so that it is easier to enable the Snap-back of the second MOS field effect transistor. In other words, this designed structure makes it possible to trigger the parasitic triode of the second MOS field effect transistor to turn on more easily and faster when an ESD event occurs, so as to form a low-impedance discharge path (an arrow in FIG. 7 shows the transfer path of a large majority of the charges during electrostatic discharge), which quickly discharges the aggregated electrostatic charges to the ground. This is favorable for the improvement of the ESD capability of the chip to better protect the components inside the chip.

As compared to the first embodiment, this embodiment reduces the voltage for enabling the Snap-back of the second MOS field effect transistor, making it possible to trigger the parasitic triode of the second MOS field effect transistor to turn on more easily and faster when an ESD event occurs, so as to form a low-impedance discharge path, which is favorable for the improvement of the ability of charge discharge.

A fifth embodiment of the application relates to a chip. The chip includes a filter circuit that is based on a MOS field effect transistor described in the above embodiments, the filter circuit is located between the power supply of the chip and the ground.

When the chip is working normally, the filter circuit presents the capacitance characteristic; when an ESD event occurs between the power supply of the chip and the ground, the filter circuit provides a low-impedance discharge path to discharge the aggregated electrostatic charges to the ground, thereby preventing the internal components of the chip from being damaged by overvoltage.

As compared to the existing technologies, it is added to this embodiment an electrostatic discharge unit on the basis of the first MOS field effect transistor, which combines the capacitance characteristic and the characteristic of the ESD discharge path needed between the power and the ground to the same circuit, so that the chip presents the capacitance characteristic during normal operation. When an ESD event occurs, a low-impedance ESD discharge path is provided between the power supply of the chip and the ground, which plays the role of ESD protection.

Those ordinarily skilled in the art can understand that the above-mentioned embodiments are specific embodiments of implementing this application. In practical applications, various changes can be made in form and in detail without deviating from the spirit and scope of the application.

What is claimed is:

1. A filter circuit that is based on a MOS field effect transistor, comprising a first MOS field effect transistor and an electrostatic discharge unit;

wherein a gate of the first MOS field effect transistor and a substrate form a filter capacitance during normal operation;

wherein the electrostatic discharge unit and the first MOS field effect transistor form a discharge path that transfers aggregated electrostatic charges to ground during electrostatic discharge;

wherein the electrostatic discharge unit comprises a second MOS field effect transistor and a third MOS field effect transistor;

a drain of the first MOS field effect transistor, a drain of the second MOS field effect transistor and a drain of the third MOS field effect transistor are interconnected; the gate of the first MOS field effect transistor, a gate of the second MOS field effect transistor and a gate of the third MOS field effect transistor are all grounded; a source of the first MOS field effect transistor with the substrate and a source of the second MOS field effect transistor with the substrate are connected to a power supply; and a source of the third MOS field effect transistor with the substrate is grounded;

wherein there is a parasitic triode between the drain and the source of the third MOS field effect transistor, and there is a parasitic resistance between a base of the parasitic triode and a substrate of the third MOS field effect transistor; wherein when a large amount of charges are aggregated at the drain of the third MOS field effect transistor, a reverse PN junction between the drain of the third MOS field effect transistor and the substrate breaks down, and a current flows to the base of the parasitic triode and to the ground through the parasitic resistance, such that the base voltage of the parasitic triode is raised and the parasitic triode is turned on and a low-impedance discharge path is formed; the discharge path provides a path for the aggregated electrostatic charges to be quickly discharged to the ground.

2. The filter circuit according to claim 1, wherein the first MOS field effect transistor is a PMOS field effect transistor, the second MOS field effect transistor is a PMOS field effect transistor, and the third MOS field effect transistor is an NMOS field effect transistor.

3. The filter circuit according to the claim 1, wherein the gate of the second MOS field effect transistor is connected to the gate of the third MOS field effect transistor and is then grounded through a resistance.

4. The filter circuit according to claim 1, wherein the overall size of the first MOS field effect transistor is larger than the overall size of the second MOS field effect transistor; and the overall size of the first MOS field effect transistor is larger than the overall size of the third MOS field effect transistor.

5. A filter circuit that is based on a MOS field effect transistor, comprising a first MOS field effect transistor and an electrostatic discharge unit;

wherein a gate of the first MOS field effect transistor and a substrate form a filter capacitance during normal operation;

wherein the electrostatic discharge unit and the first MOS field effect transistor form a discharge path that transfers aggregated electrostatic charges to ground during electrostatic discharge;

wherein the electrostatic discharge unit comprises a second MOS field effect transistor and a third MOS field effect transistor;

a drain of the first MOS field effect transistor, a drain of the second MOS field effect transistor and a drain of the third MOS field effect transistor are interconnected; a gate of the first MOS field effect transistor, a gate of the second MOS field effect transistor and a gate of the third MOS field effect transistor are all connected to a power supply; a source of the first MOS field effect transistor with the substrate and a source of the third MOS field effect transistor with the substrate are grounded; and a source of the second MOS field effect transistor with the substrate is connected to the power supply;

wherein there is a parasitic triode between the drain and the source of the second MOS field effect transistor, and there is a parasitic resistance between a base of the parasitic triode and a substrate of the second MOS field effect transistor; wherein when a large amount of charges are aggregated at the drain of the second MOS field effect transistor, a reverse PN junction between the drain of the second MOS field effect transistor and the substrate breaks down, and a current flows to the base of the parasitic triode and to the drain through the parasitic resistance, such that the base voltage of the parasitic triode drops and the parasitic triode is turned on and a low-impedance discharge path is formed; the discharge path provides a path for the aggregated electrostatic charges to be quickly discharged to the drain.

6. The filter circuit according to claim 5, wherein the first MOS field effect transistor is a NMOS field effect transistor, the second MOS field effect transistor is a PMOS field effect transistor, and the third MOS field effect transistor is a NMOS field effect transistor.

7. The filter circuit according to the claim 5, wherein the gate of the second MOS field effect transistor is connected to the gate of the third MOS field effect transistor and is then connected to the power supply through a resistance.

8. A chip, comprising a filter circuit that is based on a MOS field effect transistor, the filter circuit being provided between a power supply of the chip and a ground;

wherein the filter circuit comprises a first MOS field effect transistor and an electrostatic discharge unit;

a gate of the first MOS field effect transistor and a substrate form a filter capacitance during normal operation;

the electrostatic discharge unit and the first MOS field effect transistor form a discharge path that transfers aggregated electrostatic charges to ground during electrostatic discharge;

wherein the electrostatic discharge unit comprises a second MOS field effect transistor and a third MOS field effect transistor;

a drain of the first MOS field effect transistor, a drain of the second MOS field effect transistor and a drain of the third MOS field effect transistor are interconnected; the gate of the first MOS field effect transistor, a gate of the second MOS field effect transistor and a gate of the third MOS field effect transistor are all grounded; a source of the first MOS field effect transistor with the substrate and a source of the second MOS field effect transistor with the substrate are connected to the power supply; and a source of the third MOS field effect transistor with the substrate is grounded;

wherein there is a parasitic triode between the drain and the source of the third MOS field effect transistor, and there is a parasitic resistance between a base of the parasitic triode and a substrate of the third MOS field effect transistor; wherein when a large amount of charges are aggregated at the drain of the third MOS field effect transistor, a reverse PN junction between the drain of the third MOS field effect transistor and the substrate breaks down, and a current flows to the base of the parasitic triode and to the ground through the parasitic resistance, such that the base voltage of the parasitic triode is raised and the parasitic triode is turned on and a low-impedance discharge path is formed; the discharge path provides a path for the aggregated electrostatic charges to be quickly discharged to the ground.

9. The chip according to claim 8, wherein the first MOS field effect transistor is a PMOS field effect transistor, the second MOS field effect transistor is a PMOS field effect transistor, and the third MOS field effect transistor is an NMOS field effect transistor.

10. The chip according to the claim 8, wherein the gate of the second MOS field effect transistor is connected to the gate of the third MOS field effect transistor and is then grounded through a resistance.

11. The chip according claim 8, wherein the overall size of the first MOS field effect transistor is larger than the overall size of the second MOS field effect transistor; and the overall size of the first MOS field effect transistor is larger than the overall size of the third MOS field effect transistor.

\* \* \* \* \*